(12) United States Patent
Chen et al.

(10) Patent No.: US 12,105,144 B2
(45) Date of Patent: Oct. 1, 2024

(54) SEMICONDUCTOR DEVICE AND METHOD FOR GENERATING TEST PULSE SIGNALS

(71) Applicant: Realtek Semiconductor Corp., HsinChu (TW)

(72) Inventors: Po-Lin Chen, HsinChu (TW); Yueh-Shu Li, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 177 days.

(21) Appl. No.: 17/730,243

(22) Filed: Apr. 27, 2022

(65) Prior Publication Data
US 2022/0413044 A1    Dec. 29, 2022

(30) Foreign Application Priority Data

Jun. 28, 2021 (TW) ................................ 110123560

(51) Int. Cl.
*G01R 31/317* (2006.01)
*G06F 1/10* (2006.01)

(52) U.S. Cl.
CPC .......... *G01R 31/31726* (2013.01); *G06F 1/10* (2013.01)

(58) Field of Classification Search
CPC ........ G01R 31/31726; G01R 31/31724; G06F 1/10; G06F 1/12
See application file for complete search history.

(56) References Cited

U.S. PATENT DOCUMENTS

| | | | |
|---|---|---|---|
| 7,299,392 B2 * | 11/2007 | Date ................ | G01R 31/31922 714/739 |
| 2007/0064852 A1 * | 3/2007 | Jones ........................ | H04L 7/02 375/356 |
| 2012/0173943 A1 * | 7/2012 | Cesari ............ | G01R 31/318552 714/E11.155 |
| 2022/0018902 A1 * | 1/2022 | Cote .............. | G01R 31/318544 |

FOREIGN PATENT DOCUMENTS

TW    201901176 A    1/2019

* cited by examiner

*Primary Examiner* — April Y Blair
*Assistant Examiner* — Rong Tang
(74) *Attorney, Agent, or Firm* — Winston Hsu

(57) ABSTRACT

A semiconductor device includes a control signal generating circuit, a first circuit and a second circuit. The control signal generating circuit is configured to generate a control signal. The first circuit is coupled to the control signal generating circuit and configured to receive the control signal and generate a first test pulse signal according to the control signal. The second circuit is coupled to the control signal generating circuit and the first circuit and configured to receive the control signal and generate a second test pulse signal according to the control signal. The first circuit is comprised in the first block. The second circuit is comprised in the second block. The first block and the second block are connected with each other via one or more interconnection logics and timing of the first test pulse signal and timing of the second test pulse signal are synchronized.

16 Claims, 6 Drawing Sheets

SEMICONDUCTOR DEVICE AND METHOD FOR GENERATING TEST PULSE SIGNALS

BACKGROUND OF THE INVENTION

1. Field of the Invention

The invention relates to an architecture for full-speed domain test which is provided with a control signal generating circuit capable of supporting full-speed domain test, to solve the problem that the interconnection logic configured to connect multiple blocks cannot be tested in a large system circuit.

2. Description of the Prior Art

As the number of functions required to be included in a System On a Chip (SoC) increases, the circuit size of the SoC grows as well and causes a problem that the SoC cannot be tested unless it is divided into several smaller blocks. After dividing the SoC into several small blocks, the divided blocks are tested individually, and the interconnection logic used to connect these blocks, such as buses, transmission lines, logic gates, buffers, inverters, etc. connected between the two blocks, cannot be tested due to such structural limitation.

Some advanced techniques have been proposed to deal with this problem, but these techniques only focus on Stuck-At Fault (SAT) tests and are unable to handle the tests which are timing-related. However, it is insufficient to only perform the SAT tests since the performance of some interconnection logics, such as high-speed buses, is highly timing-dependent, and the performance of these interconnection logics may dominate the performance of the SoC.

To solve this problem, a semiconductor device with a novel architecture for full-speed domain test is required. In such architecture, a control signal generating circuit capable of supporting full-speed domain test is configured and with the control signals that are synchronized in the timing, the full-speed domain test of the interconnection logics is able to be performed.

SUMMARY OF THE INVENTION

An objective of the invention is to focus on the difficulties of interconnection logic testing.

According to an embodiment of the invention, a semiconductor device comprises a control signal generating circuit, a first circuit and a second circuit. The control signal generating circuit is configured to generate a control signal. The first circuit is coupled to the control signal generating circuit and configured to receive the control signal and generate a first test pulse signal according to the control signal. The second circuit is coupled to the control signal generating circuit and the first circuit and configured to receive the control signal and generate a second test pulse signal according to the control signal. The first circuit is comprised in a first block, the second circuit is comprised in a second block, and the first block and the second block are connected with each other via one or more interconnection logics and timing of the first test pulse signal and timing of the second test pulse signal are synchronized.

According to another embodiment of the invention, a method for generating a plurality of test pulse signals utilized for testing a plurality of blocks of a semiconductor device and one or more interconnection logics coupled between the blocks comprises: receiving an enable signal, a first clock signal and a second clock signal; using a control signal generating circuit in the semiconductor device to generate a control signal according to the enable signal, the first clock signal and the second clock signal; generating a first test pulse signal according to the control signal by a first circuit in the semiconductor device; and generating a second test pulse signal according to the control signal by a second circuit in the semiconductor device. The first circuit is comprised in a first block of the semiconductor device, the second circuit is comprised in a second block of the semiconductor device, the first block and the second block are connected with each other via one or more interconnection logics and timing of the first test pulse signal and timing of the second test pulse signal are synchronized.

These and other objectives of the present invention will no doubt become obvious to those of ordinary skill in the art after reading the following detailed description of the preferred embodiment that is illustrated in the various figures and drawings.

DETAILED DESCRIPTION

As described above, in order to solve the problem that the interconnection logics used to connect multiple blocks in the SoC cannot be tested, a semiconductor device with a novel architecture for full-speed domain test is proposed. In such architecture, a control signal generating circuit is configured as a chip-level signal generating circuit for generating a control signal inside of the semiconductor device. This control signal is provided to a plurality of blocks or a plurality of circuits in the semiconductor device for those blocks or circuits to generate timing synchronized test pulse signals according to this control signal. Since the interconnection logics can be tested only when the timings of the test pulse signals corresponding to each block are synchronized (e.g. the voltage level transitions of the test pulse signals occur at the same time, or such transitions are aligned), with the proposed architecture, the problem that the timings of the test pulse signals corresponding to each block are unable to be synchronized can be solved, and the full-speed domain test of the interconnection logics can be effectively performed with the timing of the control signals being synchronized.

Figure 1:
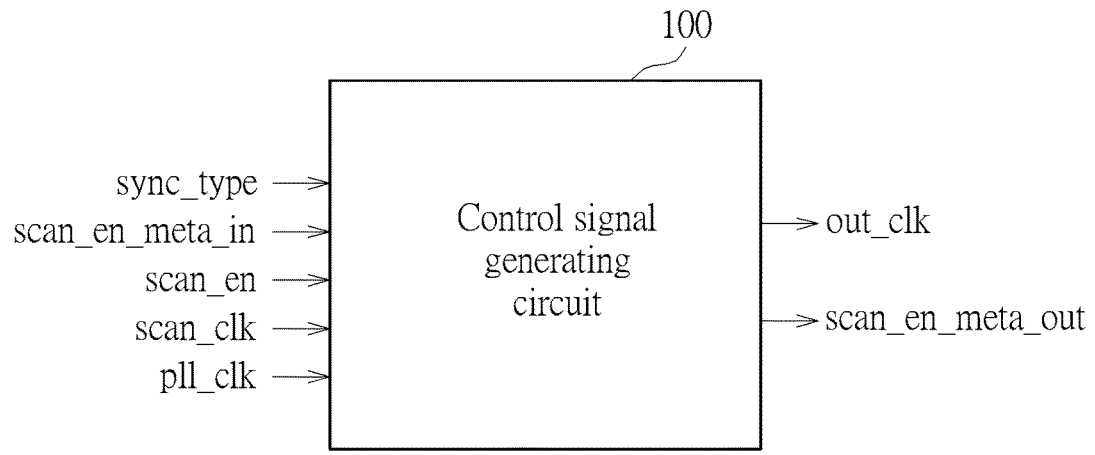
FIG. 1 is a schematic diagram of a control signal generating circuit according to an embodiment of the invention.

FIG. 1 is a schematic diagram of a control signal generating circuit according to an embodiment of the invention. According to an embodiment of the invention, the control signal generating circuit 100 may be configured inside of a semiconductor device, e.g. configured in an SoC, and provided as a chip-level signal generating circuit for providing control signals to a plurality of blocks or circuits inside the chip. As an example, the control signal generating circuit 100 may be a chip-level On chip Clock Controller (OCC) configured in an SoC.

The control signal generating circuit 100 may receive an enable signal scan_en, a clock signal scan_clk and another clock signal pll_clk. The enable signal scan_en may be a signal configured to enable or trigger a test process, and may be provided by a signal source outside of the semiconductor device. As an example, the enable signal scan_en may be provided by a test device (e.g. an external test machine). The clock signal scan_clk may be a low frequency clock signal and may be provided by a clock source outside of the semiconductor device. The clock signal pll_clk may be a high frequency clock signal and may be provided by a clock generating circuit inside the semiconductor device, wherein the frequency of the clock signal pll_clk may be higher than the frequency of the clock signal scan_clk. As an example, the clock signal pll_clk may be generated by a Phase-locked loop (PLL) inside the semiconductor device.

The enable signal scan_en may be controlled by the test device and may be switched according to the length of an input scan vector. The control signal generating circuit 100 may convert the enable signal scan_en into a stable control signal scan_en_meta_out according to the clock signal scan_clk and the clock signal pll_clk, and the control signal scan_en_meta_out corresponds to the clock domain of the relatively high frequency clock signal pll_clk.

In the embodiments of the invention, the control signal scan_en_meta_out may be received by a circuit in a next stage, and for the circuit receiving the control signal, the received control signal scan_en_meta_out is a synchronized enable signal (i.e., the enable signal that has been synchronized). As an example, the control signal scan_en_meta_out output by the control signal generating circuit 100 may be provided for a circuit in a next stage as a synchronized enable signal scan_en_meta_in, so that the circuit in a next stage may generate the corresponding test pulse signal according to the synchronized enable signal.

In addition to the control signal scan_en_meta_out, the control signal generating circuit 100 may further generate an output clock signal out_clk according to the clock signal pll_clk and the control signal scan_en_meta_out generated by itself or the synchronized enable signal scan_en_meta_in it received. In the functional mode (i.e., the normal mode relative to the test mode), the output clock signal out_clk output by the control signal generating circuit 100 is a continuous clock signal, which may be received by a circuit in the next stage as a clock signal for driving the circuit in the next stage. In the test mode, the output clock signal out_clk is a test pulse signal generated by the control signal generating circuit 100, and the test pulse signal may include a specific number (e.g., one or two) of test pulses.

In addition, the control signal generating circuit 100 may further receive a synchronization type setting signal sync_type, and selectively generate the output clock signal out_clk according to the control signal scan_en_meta_out generated by itself or the synchronized enable signal scan_en_meta_in it received based on the setting value of the synchronization type setting signal sync_type.

Figure 2:
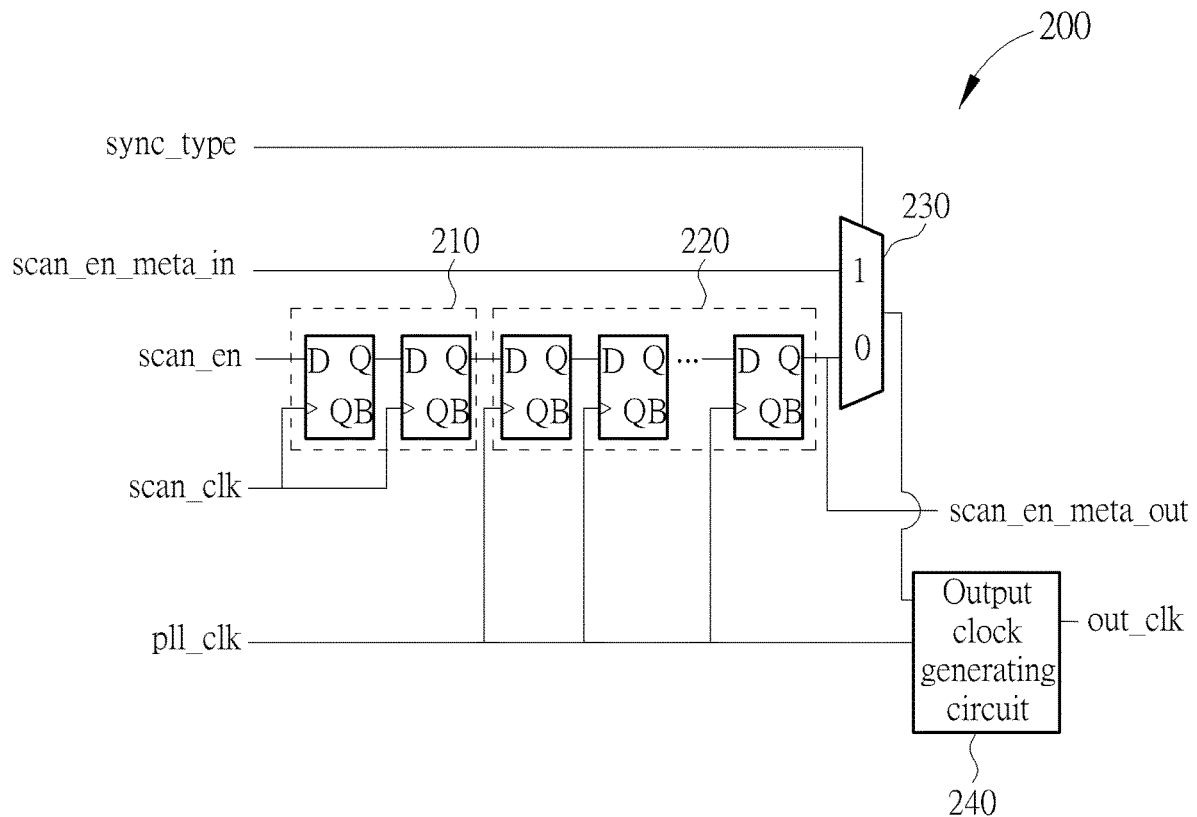
FIG. 2 is an exemplary circuit diagram of a control signal generating circuit according to an embodiment of the invention.

FIG. 2 is an exemplary circuit diagram of a control signal generating circuit for implementing the control signal generating circuit 100 as shown in FIG. 1 according to an embodiment of the invention. The control signal generating circuit 200 may comprise driving circuits 210 and 220, a multiplexer 230 and an output clock generating circuit 240. The driving circuit 210 and the driving circuit 220 may respectively comprise a plurality of D Flip Flops (DFFs) coupled in serial. Note that the number of DFFs is not limited to what is shown in FIG. 2. The driving circuit 210 may receive the enable signal scan_en as an input, receive the clock signal scan_clk as the clock input, and generate an intermediate signal according to the clock signal scan_clk and the enable signal scan_en. As an example, when the signal level of the clock signal scan_clk changes from logic 0 to logic 1, the value of the output of the DFF will be equal to the value of the input of the DFF (e.g., the value of the enable signal scan_en), thereby generating the intermediate signal.

The driving circuit 220 receives the intermediate signal output by the driving circuit 210 as an input, receive the clock signal pll_clk as the clock input, and generate the control signal scan_en_meta_out according to the clock signal pll_clk and the intermediate signal. As an example, when the signal level of the clock signal pll_clk changes from logic 0 to logic 1, the value of the output of the DFF will be equal to the value of the input of the DFF, thereby generating the control signal scan_en_meta_out.

In the embodiments of the invention, the driving circuits 210 and 220 are configured to process the enable signal scan_en across different clock domains, so as to synchronize the signals coming from different clock domains by using a plurality of DFFs coupled in serial. As an example, it is assumed that the clock domain driven by the control signal generating circuit 100/200 is designed to be the same as the clock domain of the clock signal pll_clk, and received enable signal scan_en is a signal comes from another different clock domain, for example, the clock domain of the clock signal scan_clk, the control signal generating circuit 100/200 may use the driving circuits 210 and 220 to synchronize the enable signal scan_en which comes from a different clock domain, so that the control signal scan_en_meta_out which is stable and corresponds to the clock domain of the clock signal pll_clk is finally output by the control signal generating circuit 100/200. In the embodiments of the invention, the clock domain driven by the control signal generating circuit 100/200 may refer to the operating frequency of one or more circuits in the next stage driven by the output clock signal out_clk output by the control signal generating circuit 100/200 under the functional mode.

The multiplexer 230 may receive the synchronization type setting signal sync_type as a selection signal. The multiplexer 230 may selectively output the control signal scan_en_meta_out or the synchronized enable signal scan_en_meta_in received from the circuit in a previous stage based on the setting value of the synchronization type setting signal sync_type. The output clock generating circuit 240 may receive the clock signal pll_clk and the output of the multiplexer 230, and may comprise, but not be limited to, one or more DFF coupled in serial and one or more logic gates for generating the output clock signal out_clk.

Figure 3:
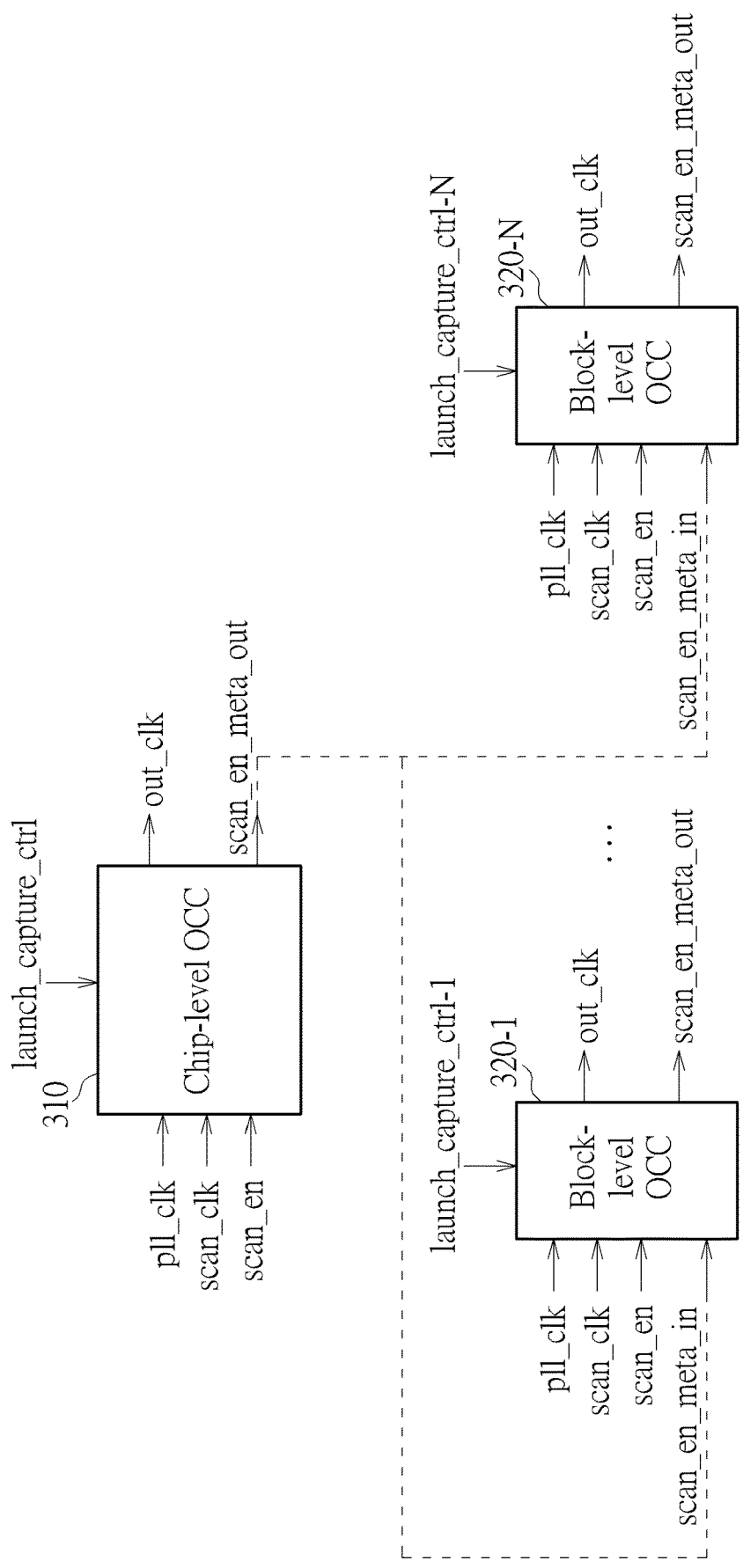
FIG. 3 shows an exemplary architecture for full-speed domain test according to an embodiment of the invention.

FIG. 3 shows an exemplary architecture for full-speed domain test according to an embodiment of the invention. In the embodiments of the invention, the full-speed domain test architecture may comprise hierarchical control signal generating circuits, and architecture for full-speed domain test may be built in a semiconductor device. In an embodiment of the invention, a semiconductor device may comprise a plurality of blocks, each block may be an assembly of a plurality of circuits, or may be regarded as a functional block for providing a predetermined function. Each block may operate independently to provide corresponding functions, and may be connected with each other through one or more interconnection logics, such as the interconnection logic 440 shown in FIG. 4, to communicate with each other or transfer various data or signals via the interconnection logics.

The proposed architecture for full-speed domain test may comprise a chip-level signal generating circuit, such as the chip-level OCC 310, and a plurality of block-level signal generating circuit, such as the N block-level OCCs 320-1 to 320-N, where N is a positive integer greater than 1. According to an embodiment of the invention, the block-level OCCs 320-1 to 320-N may be respectively comprised in the corresponding block 1 to block N (not shown in the figure) on the chip, to serve as a clock generator inside of the corresponding block, and the chip-level OCC 310 may be utilized as a clock generator inside of the chip.

According to an embodiment of the invention, the chip-level OCC 310 may be implemented by the control signal generating circuit shown in FIG. 2 or may comprise the circuit structure shown in FIG. 2.

In an embodiment of the invention, the control signal scan_en_meta_out output by the chip-level OCC 310 will be provided to the block-level OCC 320-1~320-N as the synchronized enable signal scan_en_meta_in of the block-level OCCs. In addition, in the embodiments of the invention, the control signal scan_en_meta_out generated by the chip-level OCC 310 satisfies the timing criteria of the highest operating frequency applicable by the chip-level OCC and block-level OCCs.

According to an embodiment of the invention, the block-level OCCs 320-1 to 320-N may be implemented by the control signal generating circuit shown in FIG. 2 or may have the circuit structure shown in FIG. 2. In addition, the block-level OCCs 320-1 to 320-N may respectively receive a corresponding test pattern control signal launch_capture_ctrl-1~launch_capture_ctrl-N. For example, in response to the output of the multiplexer 230, the output clock generating circuit 240 shown in FIG. 2 may select one or more clock pulses of the clock signal pll_clk to be output as the output clock signal out_clk according to the test pattern control signal. Similarly, the chip-level OCC 210 may also receive the corresponding test pattern control signal launch_capture_ctrl. The test pattern control signals will be introduced in more detained in the following paragraphs.

Figure 4:
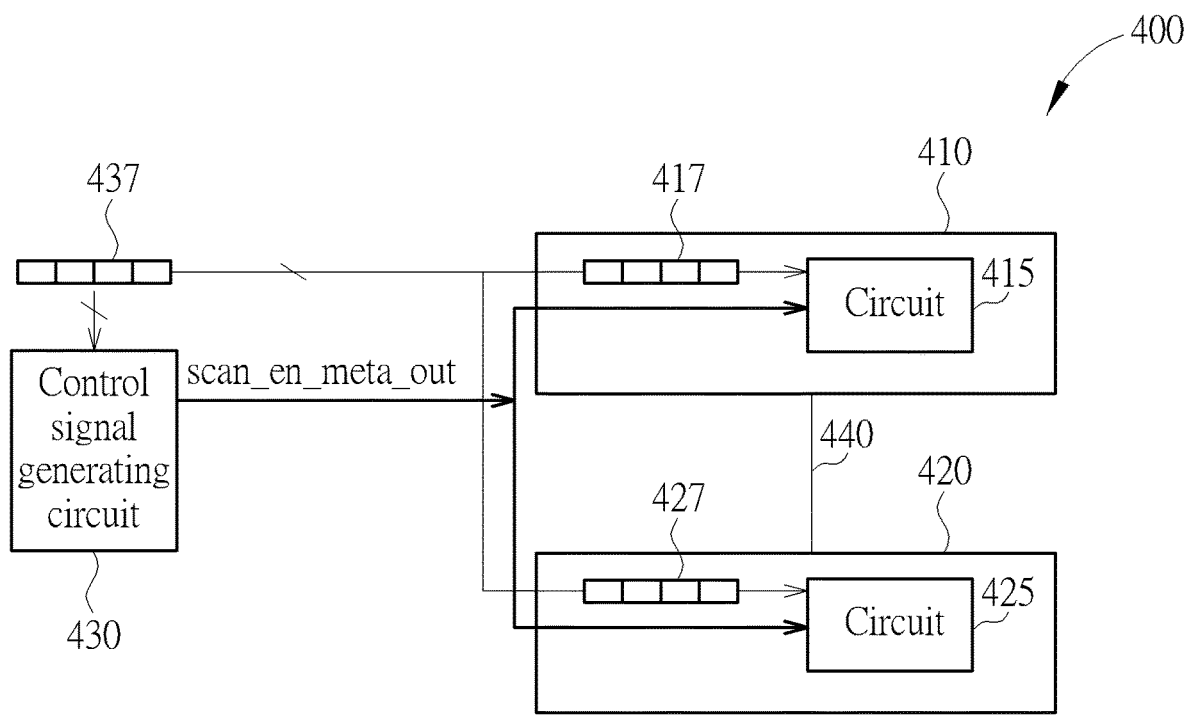
FIG. 4 is a schematic diagram of a semiconductor device according to an embodiment of the invention.

FIG. 4 is a schematic diagram of a semiconductor device according to an embodiment of the invention. The semiconductor device 400 may comprise a block 410, a block 420, a control signal generating circuit 430 and an interconnection logic 440. The control signal generating circuit 430 may be a chip-level signal generating circuit, such as the aforementioned chip-level OCC, and may be implemented by the control signal generating circuit shown in FIG. 2 or may have the circuit structure shown in FIG. 2. The blocks 410 and 420 may respectively comprise the corresponding circuits 415 and 425, wherein the circuits 415 and 425 may be the block-level signal generating circuits, such as the aforementioned block-level OCCs. The circuit 415 and the circuit 425 may also be implemented by the control signal generating circuit shown in FIG. 2 or may have the circuit structure shown in FIG. 2. In addition, the semiconductor device 400 may further comprise a plurality of M-bits registers, such as the register 417, the register 427 and the register 437, configured to store the test pattern, for controlling specific clock pulses to be provided the device under test.

The control signal generating circuit 430 and the circuits 415 and 425 may respectively generate the output clock signal out_clk (or, the test pattern control signal) according to the setting value of each bit in the corresponding register.

According to an embodiment of the invention, the control signal generating circuit 430 may generate the synchronized control signal scan_en_meta_out through the operations of aforementioned clock domain conversion. The control signal scan_en_meta_out may be provided to the circuits 415 and 425 in each block as the synchronized enable signal scan_en_meta_in, for the circuits 415 and 425 to be enabled at the same time in response to the synchronized enable signal scan_en_meta_in and to generate the corresponding test pulse signal according to the setting value of each bit in the corresponding register.

It is to be noted that, under the condition when the signal transmission distance between the control signal generating circuit 430 and the circuit 415 and the signal transmission distance between the control signal generating circuit 430 and the circuit 425 are substantially equal, or timing of the signals sent by the control signal generating circuit 430 to the circuits 415 and 425 have already been compensated based on the respective transmission distances, the timings of the test pulse signals respectively generated by the circuit 415 and the circuit 425 based on the control signal scan_en_meta_out (i.e., the synchronized enable signal scan_en_meta_in received by the circuits 415 and 425) are substantially synchronous. Here, the timing synchronization may comprise frequency synchronization and/or phase synchronization. That is, there is no timing defect between two signals. As an example, in an embodiment of the invention, the clock domain triggered by the circuit 415 and the clock domain triggered by the circuit 425 are the same, and which are also the same as the clock domain of the clock signal pll_clk. The timing synchronization may manifested on that, as an example, when the same bits are set (e.g. set to logic 1) in the register 417 and in the register 427, the test pulse signal generate by the circuit 415 and the test pulse signal generate by the circuit 425 will have transition in the voltage level at the same time, or, the transition or the rising or the falling edge of the pulses are aligned.

In addition, it is to be noted that the insurmountable problem in the conventional art is that the timings of the test pulse signals cannot be synchronized, and the factors that cause the timings of the test pulse signals cannot be synchronized include that the time difference or timing defect between the arrival time at which the control signal arrives one block and the arrival time at which the control signal arrives another cannot be compensated. The reason that the time difference or timing defect cannot be compensated is that no chip-level signal generating circuit exists in the conventional art, and the control signal for enabling or triggering the test process is provided by an external signal source. Because there is a huge number of blocks that have to receive this control signal and these blocks may correspond to different clock domains, the excessive number of receiving blocks and clock domains makes it difficult to synchronize the timing of the control signals received by each block, thereby the problem that the interconnection logic configured to connect multiple blocks cannot be tested is generated.

In the embodiments of the invention, by forming an architecture for full-speed domain test with a control signal generating circuit capable of supporting full-speed domain test, the time difference, which is generated due to the difference in the length of the transmission paths, between the signals in the chip-level signal generating circuit and the block-level signal generating circuit is easily compensated, and this makes the control signal to be simultaneously provided to block-level signal generating circuit configured in each block for these blocks to be enabled at the same time. In this manner, the timing of the test pulse signals respectively generated by the block-level signal generating circuits configured in different blocks will be synchronized, and by having timing synchronized test pulse signals, the interconnection logic connected between different blocks are able to be tested. Generation of test pulse signal will be introduced in more detailed in the following paragraphs.

Referring again to FIG. 4, according to an embodiment of the invention, the register in each block, such as the register 417 and register 427, is configured to control the waveform of the test pulse signal respectively generated by the corresponding block. The register configured outside of the blocks, such as the register 437, may be configured to control the waveforms of the test pulse signals generated by all blocks. That is, in the embodiments of the invention, the register configured outside of the blocks may be the chip-level register and may be shared among the blocks. In the embodiments of the invention, a multiplexer circuit may be utilized to select whether to use the register outside of the blocks (e.g. the chip-level register) or the register inside of a block (e.g. the block-level register) as a register source to generate the test pattern control signal, such as the test pattern control signal launch_capture_ctrl-1-launch_capture_ctrl-N as shown in FIG. 3.

Figure 5:
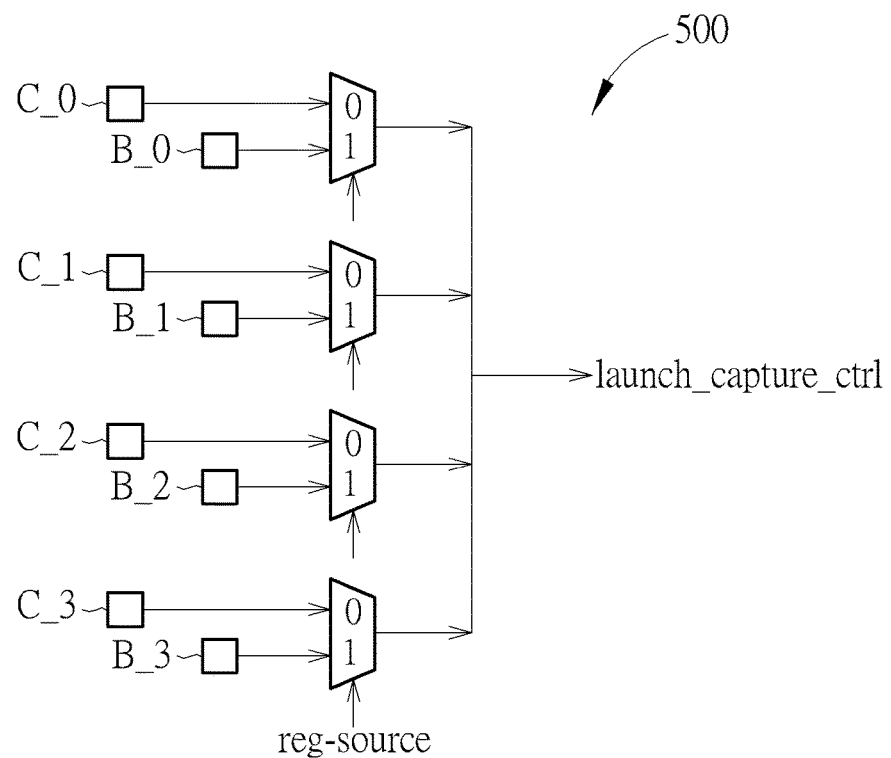
FIG. 5 is a schematic diagram of a multiplexer circuit according to an embodiment of the invention.

FIG. 5 is a schematic diagram of a multiplexer circuit according to an embodiment of the invention. Suppose that the register is a 4-bit register and the multiplexer circuit configured to select the register source may comprise four branches, each branch may comprise one multiplexer. A first input terminal of each multiplexer may be configure to receive one bit of the chip-level register, e.g., one of the bits C_0-C_3 of the chip-level register shown in FIG. 5, and a second input terminal of each multiplexer may be configure to receive one bit of the block-level register, e.g., one of the bits B_0-B_3 of the block-level register as shown in FIG. 5. Each multiplexer may further receive a source selection signal reg_source and sequentially output a specific input bit selected based on the current setting value of the source selection signal reg_source as the test pattern control signal. As an example, suppose that the 4-bit test pattern stored in the chip-level register is "1010" and the 4-bit test pattern stored in the block-level register is "1100" and if the value of the source selection signal reg_source is now set to 1 for selecting the chip-level register as the register source, the test pattern control signal (using the label launch_capture_ctrl as a representative) output by the multiplexer circuit 500 is a signal comprising the setting values the four bits as "1010". It is to be noted that in some embodiments of the invention, the values of the register may also be utilized to forcibly turn off the circuit that does not need to be tested. As an example, the values of all bits of the register may be set to '0' to turn off the corresponding circuit.

Figure 6:
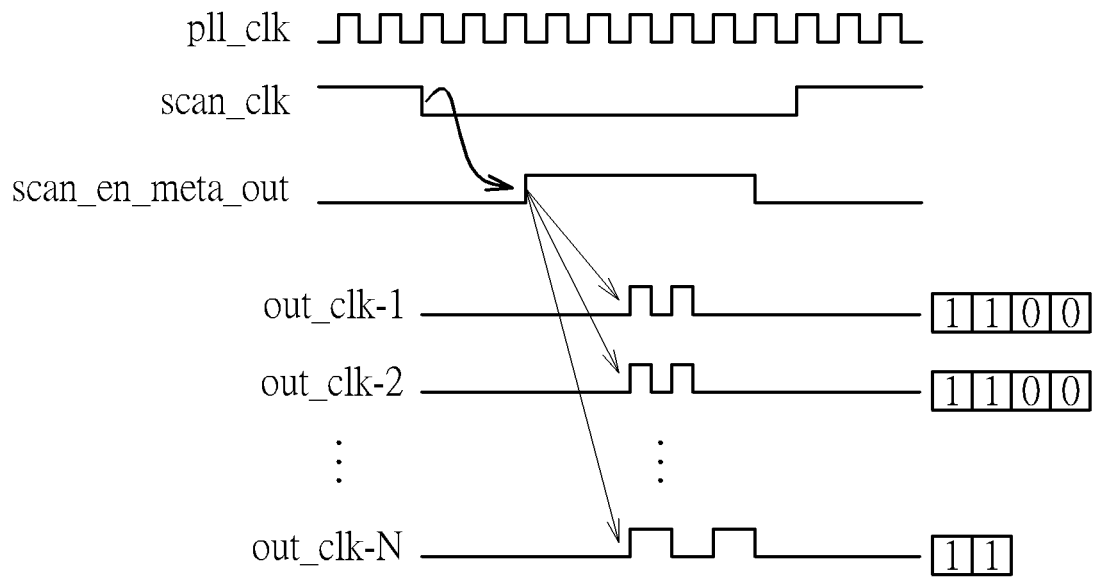
FIG. 6 shows exemplary signal waveforms according to an embodiment of the invention.

FIG. 6 shows exemplary signal waveforms according to an embodiment of the invention. The period in which the enable signal scan_en is pulled high is a shift phase, and the test pattern may be loaded into the corresponding register in the shift phase. The period in which the enable signal scan_en is pulled low is a capture phase, and the signal generating circuit, e.g. the signal generating circuit 100, 200, 430 and/or the chip-level OCC 310, may generate the control signal scan_en_meta_out in response to the low voltage level of the enable signal scan_en. The control signal scan_en_meta_out may be provided to multiple circuits in a next stage, e.g. the block-level OCC 320-1~320-N and/or the circuits 415 and 425, as the synchronized enable signal scan_en_meta_in thereof for simultaneously enabling those circuits for those circuits to start the test process synchronously.

In response to the control signal scan_en_meta_out (or, the synchronized enable signal scan_en_meta_in), each circuit may selectively output one or more clock pulses of the clock signal pll_clk as the corresponding test pulse signal according to the value of the bits stored in the register (or, according to the corresponding test pattern control signal). As an example, in the embodiment shown in FIG. 6, the control signal scan_en_meta_out may be provided to N block-level OCCs. The output clock signals out_clk-1, out_clk-2 . . . out_clk-N shown in FIG. 6 respectively represent the test pulse signals generated by the first to the N-th block-level OCC according to the value of the bits stored in the corresponding registers, and the value of the bits stored in the corresponding registers are shown in the right hand side in FIG. 6.

As shown in FIG. 6, a rising or falling edge of a pulse in the output clock signals out_clk-1, out_clk-2 . . . out_clk-N are aligned. Therefore, the timings of the test pulse signals generated by the first to the N-th block-level OCC are synchronized. When the timings of the test pulse signals are synchronized, the interconnection logic connected between the blocks can be test in the test process.

Figure 7:
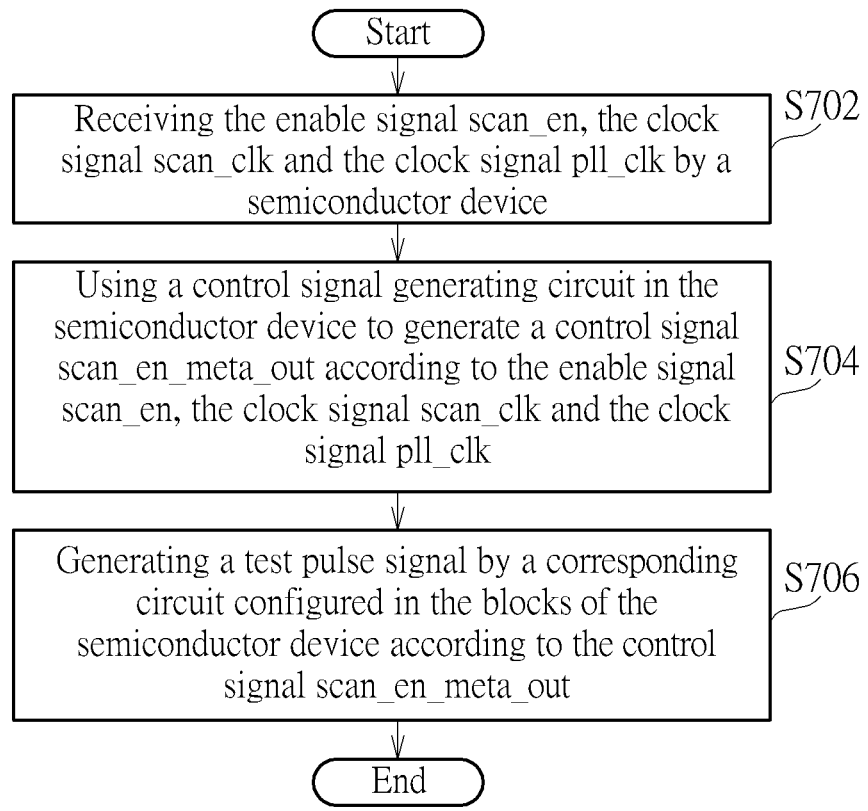
FIG. 7 shows an exemplary flow chart of a method for generating test pulse signals according to an embodiment of the invention.

FIG. 7 shows an exemplary flow chart of a method for generating test pulse signals according to an embodiment of the invention. The method is configured to generate the test pulse signals utilized for testing a plurality of blocks of a semiconductor device and one or more interconnection logics coupled between the blocks. The method for generating test pulse signals comprises the following steps:

Step S702: The enable signal scan_en, the clock signal scan_clk and the clock signal pll_clk are received by a semiconductor device.

Step S704: A control signal generating circuit, e.g. a chip-level OCC, in the semiconductor device is used to generate a control signal scan_en_meta_out according to the enable signal scan_en, the clock signal scan_clk and the clock signal pll_clk.

Step S706: A test pulse signal is generated by a corresponding circuit, e.g. a block-level OCC, configured in the blocks of the semiconductor device according to the control signal scan_en_meta_out.

Since the circuits in the blocks are enabled synchronously to generate the corresponding test pulse signal in response to the control signal scan_en_meta_out, the timings of the test pulse signals are synchronized.

In some embodiments of the invention, one block may also comprise multiple different clock domains. To be more specific, one block may comprise a plurality of circuits, e.g. a plurality of block-level OCCs, and the cock domains driven by these circuits may be different. As an example, in the embodiment shown in FIG. 6, a frequency corresponding to the clock domain driven by the N-th block-level OCC may be half of a frequency corresponding to the clock domain driven by the other block-level OCC. Therefore, the pulse width of the corresponding test pulse signal is twice that of the other test pulse signals.

Figure 8:
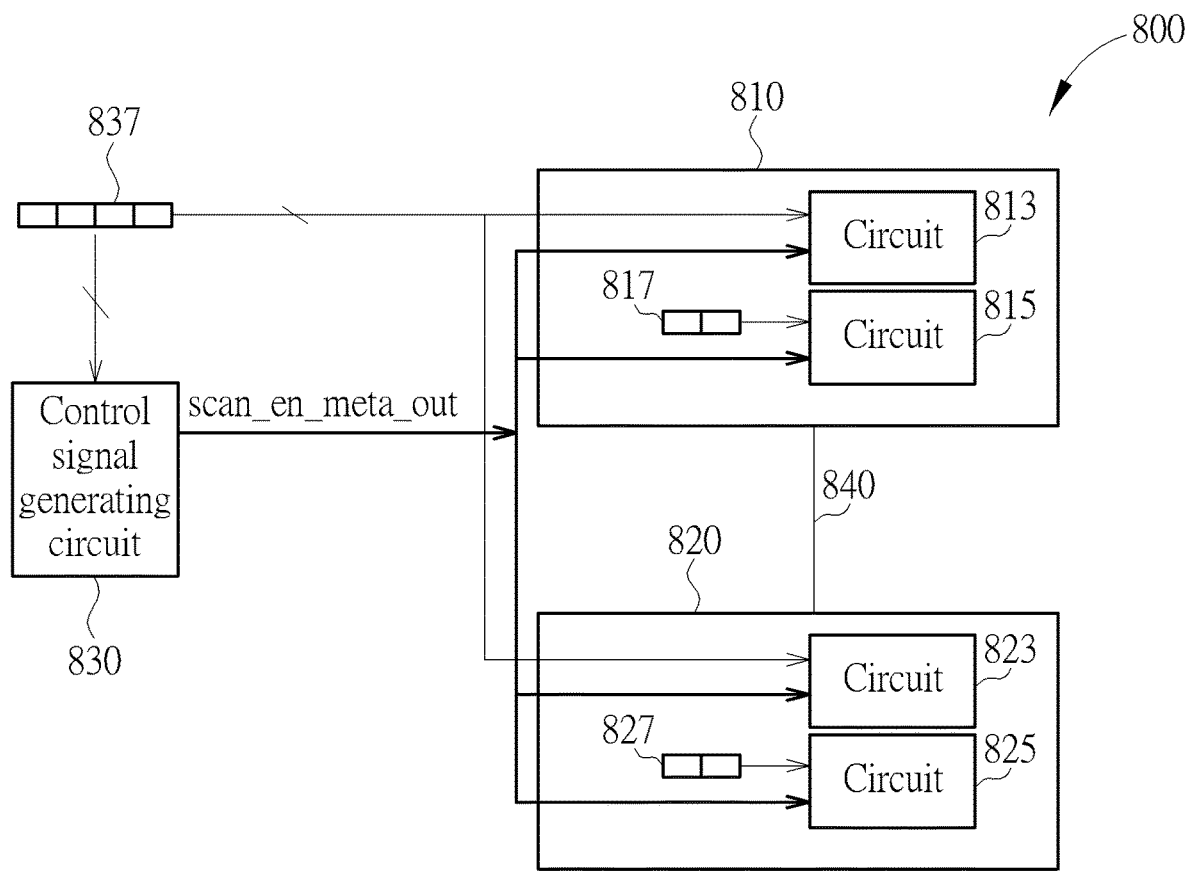
FIG. 8 is a schematic diagram of a semiconductor device according to another embodiment of the invention.

FIG. 8 is a schematic diagram of a semiconductor device according to another embodiment of the invention. The semiconductor device 800 may comprise a block 810, a block 820, a control signal generating circuit 830 and an interconnection logic 840. The control signal generating circuit 830 may be a chip-level signal generating circuit, such as the aforementioned chip-level OCC, and may be implemented by the control signal generating circuit shown in FIG. 2 or may have the circuit structure shown in FIG. 2. The block 810 may comprise a circuit 813 and a circuit 815, and the block 820 may comprise a circuit 823 and a circuit 825. These circuits may be the block-level signal generating circuits, such as the aforementioned block-level OCCs, and may also be implemented by the control signal generating circuit shown in FIG. 2 or may have the circuit structure shown in FIG. 2.

According to another embodiment of the invention, one block may also comprise multiple different clock domains. As an example, the clock domain driven by the circuit 813 and the clock domain driven by the circuit 815 may be different and the clock domain driven by the circuit 823 and the clock domain driven by the circuit 825 may be different. The circuit outputting the clock signal having a higher frequency for driving the circuit with higher operating frequency in a next stage may be a master circuit, and the circuit outputting the clock signal having a lower frequency for driving the circuit with lower operating frequency in the next stage may be a slave circuit. As an example, the two clock domains within one block may be respectively a full-speed clock domain and a half-speed clock domain, and the frequency of the clock signal output by the master circuit may be twice that of the clock signal output by the slave circuit.

In this embodiment, the circuits 813 and 823 may be the master circuits in the corresponding blocks and may share the chip-level register 830, and the circuits 815 and 825 may be the slave circuits in the corresponding blocks and may be configured with dedicated registers 817 and 827.

The circuits 813, 815, 823 and 825 may receive the control signal scan_en_meta_out and may be enabled synchronously in response to the control signal scan_en_meta_out, so as to generate the test pulse signals having synchronous timing.

Figure 9:
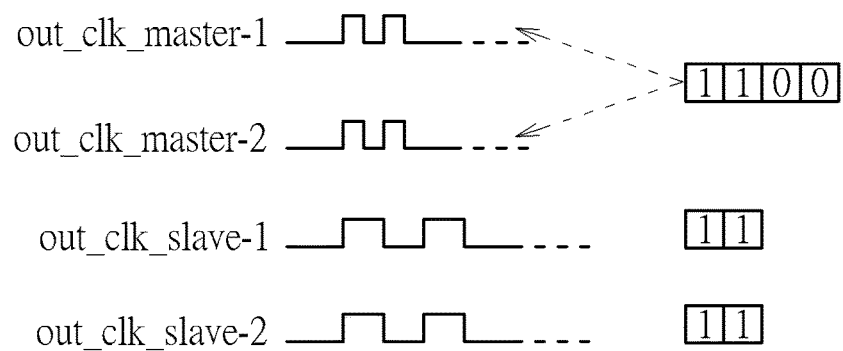
FIG. 9 shows exemplary signal waveforms according to an alternative embodiment of the invention.

FIG. 9 shows exemplary signal waveforms according to another embodiment of the invention. The example shown in FIG. 9 may correspond to the test architecture shown in FIG. 8. In this embodiment, the 4-bit test pattern stored in the chip-level register 830 is "1100" and the 2-bit test patterns stored in the block-level registers 817 and 827 are "11". The output clock signals out_clk_master-1 and out_clk_master-2 are respectively the test pulse signal generated by the corresponding master circuit (e.g. the circuits 813 and 823) according to the test pattern stored in the corresponding register, the output clock signals out_clk_slave-1 and out_clk_slave-2 are respectively the test pulse signal generated by the corresponding slave circuit (e.g. the circuits 815 and 825) according to the test pattern stored in the corresponding register, and the value of the bits stored in the corresponding registers are shown in the right hand side in FIG. 9. As shown in FIG. 9, a rising or falling edge of a pulse in the test pulse signals generated by the master circuits are aligned. In addition, a rising or falling edge of a pulse in the test pulse signal generated by the master circuit and a rising or falling edge of a pulse in the test pulse signal generated by the slave circuit are aligned. In this manner, either the circuits in the same block or the circuits in different blocks and connected with each other through the interconnection logic 840 are enabled synchronously and are able to generate the test pulse signals with synchronous timing.

Figure 10:
FIG. 10 shows exemplary signal waveforms according to yet another embodiment of the invention.
Figure 10:
Figure 10:
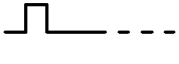
Figure 10:

FIG. 10 shows exemplary signal waveforms according to yet another embodiment of the invention. In this embodiment, the first set of output clock signals out_clk_master-1 and out_clk_slave-1 are respectively the test pulse signals generated by the master circuit and the slave circuit in the first block according to the test pattern stored in the corresponding register, the second set of output clock signals out_clk_master-2 and out_clk_slave-2 are respectively the test pulse signals generated by the master circuit and the slave circuit in the second block according to the test pattern stored in the corresponding register, and the value of the bits stored in the corresponding registers are shown in the right hand side in FIG. 10. As shown in FIG. 10, a rising or falling edge of a pulse in the test pulse signal generated by the master circuit and a rising or falling edge of a pulse in the test pulse signal generated by the slave circuit are aligned. In this manner, either the circuits in the same block or the circuits in different blocks and connected with each other through the interconnection logic 840 are enabled synchronously and are able to generate test pulse signals with synchronous timing.

It is to be noted that although aligned rising or falling edge of the second set of output clock signals out_clk_master-2 and out_clk_slave-2 is not shown in FIG. 10, the timings of these two signals with different clock domains are actually synchronized. That is, there is no timing defect between two pulses of these two signals, and the pulses of these two signals are sequentially generated without timing defect. In this manner, the interface connected between the master circuit and the slave circuit can be tested. In addition, it is to be noted that in the embodiments of the invention, the interface between a master circuit and a slave circuit across different blocks (e.g. a transmission interface comprising the interconnection logic 840) can also be tested by using the synchronized test pulses.

In summary, in the embodiments of the invention, with the proposed architecture for full-speed domain test with a control signal generating circuit capable of supporting full-speed domain test as discussed above, the time difference, which is generated due to the difference in the length of the transmission paths, between the signals in the chip-level signal generating circuit and the block-level signal generating circuit is easily compensated, thereby solving the problem of difficulty in compensating for timing defects in the conventional art. In addition, the control signals are simultaneously provided to block-level signal generating circuits configured in each block for these blocks to be enabled at the same time. In this manner, the timings of the test pulse signals respectively generated by the block-level signal generating circuits are synchronous. With synchronous timings of the test pulse signals, the interconnection logic between the blocks can be tested in the test process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a control signal generating circuit, configured to generate a control signal;

a first circuit, coupled to the control signal generating circuit and configured to receive the control signal and generate a first test pulse signal according to the control signal; and a second circuit, coupled to the control signal generating circuit and the first circuit and configured to receive the control signal and generate a second test pulse signal according to the control signal, wherein the first circuit is comprised in a first block, the second circuit is comprised in a second block, the first block and the second block are connected with each other via one or more interconnection logics and timing of the first test pulse signal and timing of the second test pulse signal are synchronized;

wherein the semiconductor device further comprises a first register corresponding to the first circuit, a second register corresponding to the second circuit, and a third register corresponding to the control signal generating circuit; the third register is shared by the first block and the second block; and a waveform of the first test pulse signal is controlled according to a plurality of bits stored in the first register and a plurality of bits stored in the third register, and a waveform of the second test pulse signal is controlled according to a plurality of bits stored in the second register and the plurality of bits stored in the third register.

2. The semiconductor device as claimed in claim 1, wherein the control signal generating circuit is configured to receive an enable signal, a first clock signal and a second clock signal and the control signal generating circuit comprises:

a first driving circuit, configured to generate an intermediate signal according to the first clock signal and the enable signal; and a second driving circuit, configured to generate the control signal according to the second clock signal and the intermediate signal, wherein a frequency of the second clock signal is higher than a frequency of the first clock signal.

3. The semiconductor device as claimed in claim 2, wherein a clock domain driven by the first circuit and a clock domain driven by the second circuit are identical to a clock domain of the second clock signal.

4. The semiconductor device as claimed in claim 2, wherein the first circuit is further configured to receive the second clock signal and selectively output one or more clock pulses of the second clock signal as the first test pulse signal according to the control signal, the plurality of bits stored in the first register, and the plurality of bits stored in the third register, and the second circuit is further configured to receive the second clock signal and selectively output one or more clock pulses of the second clock signal as the second test pulse signal according to the control signal, the plurality of bits stored in the second register, and the plurality of bits stored in the third register.

5. The semiconductor device as claimed in claim 1, further comprising:

a third circuit, comprised in the first block and coupled to the control signal generating circuit and the first circuit, and configured to receive the control signal and generate a third test pulse signal according to the control signal, wherein the timing of the first test pulse signal and timing of the third test pulse signal are synchronized.

6. The semiconductor device as claimed in claim 5, wherein a clock domain driven by the first circuit and a clock domain driven by the third circuit are different.

7. The semiconductor device as claimed in claim 5, wherein a rising/falling edge of a pulse of the first test pulse signal and a rising/falling edge of a pulse of the third test pulse signal are aligned.

8. The semiconductor device as claimed in claim 1, wherein a rising/falling edge of a pulse of the first test pulse signal and a rising/falling edge of a pulse of the second test pulse signal are aligned.

9. A method for generating a plurality of test pulse signals utilized for testing a plurality of blocks of a semiconductor device and one or more interconnection logics coupled between the blocks, comprising:

receiving an enable signal, a first clock signal and a second clock signal;

using a control signal generating circuit in the semiconductor device to generate a control signal according to the enable signal, the first clock signal and the second clock signal;

generating a first test pulse signal according to the control signal by a first circuit in the semiconductor device; and generating a second test pulse signal according to the control signal by a second circuit in the semiconductor device, wherein the first circuit is comprised in a first block of the semiconductor device, the second circuit is comprised in a second block of the semiconductor device, the first block and the second block are connected with each other via one or more interconnection logics and timing of the first test pulse signal and timing of the second test pulse signal are synchronized;

wherein the semiconductor device further comprises a first register corresponding to the first circuit, a second register corresponding to the second circuit, and a third register corresponding to the control signal generating circuit; the third register is shared by the first block and the second block; and a waveform of the first test pulse signal is controlled according to a plurality of bits stored in the first register and a plurality of bits stored in the third register, and a waveform of the second test pulse signal is controlled according to a plurality of bits stored in the second register and the plurality of bits stored in the third register.

10. The method as claimed in claim 9, wherein step of using the control signal generating circuit in the semiconductor device to generate the control signal according to the enable signal, the first clock signal and the second clock signal further comprises:

generating an intermediate signal according to the first clock signal and the enable signal by a first driving circuit; and generating the control signal according to the second clock signal and the intermediate signal by a second driving circuit, wherein a frequency of the second clock signal is higher than a frequency of the first clock signal.

11. The method as claimed in claim 9, wherein a clock domain driven by the first circuit and a clock domain driven by the second circuit are identical to a clock domain of the second clock signal.

12. The method as claimed in claim 9, wherein step of generating the first test pulse signal according to the control signal by the first circuit in the semiconductor device further comprises:

receiving the second clock signal; and selectively outputting one or more clock pulses of the second clock signal as the first test pulse signal according to the control signal, the plurality of bits stored in the first register, and the plurality of bits stored in the third register, and step of generating the second test pulse signal according to the control signal by the second circuit in the semiconductor device further comprises:

receiving the second clock signal; and selectively outputting one or more clock pulses of the second clock signal as the second test pulse signal according to the control signal, the plurality of bits stored in the second register, and the plurality of bits stored in the third register.

13. The method as claimed in claim 9, further comprising:

generating a third test pulse signal according to the control signal by a third circuit in the semiconductor device, wherein the third circuit is comprised in the first block and the timing of the first test pulse signal and timing of the third test pulse signal are synchronized.

14. The method as claimed in claim 13, wherein a clock domain driven by the first circuit and a clock domain driven by the third circuit are different.

15. The method as claimed in claim 13, wherein a rising/falling edge of a pulse of the first test pulse signal and a rising/falling edge of a pulse of the third test pulse signal are aligned.

16. The method as claimed in claim 9, wherein a rising/falling edge of a pulse of the first test pulse signal and a rising/falling edge of a pulse of the second test pulse signal are aligned.

* * * * *